United States Patent [19]

Johnson, Jr.

[11] 4,119,911

[45] Oct. 10, 1978

[54] MAGNETORESISTOR DISPLACEMENT SENSOR USING A MAGNETORESISTOR POSITIONED BETWEEN RELATIVELY MOVING MAGNETIZED TOOTHED MEMBERS

[76] Inventor: Clark E. Johnson, Jr., 60 Pinecroft Rd., Weston, Mass. 02193

[21] Appl. No.: 789,790

[22] Filed: Apr. 22, 1977

[51] Int. Cl.$^2$ ............................................. G01R 33/12
[52] U.S. Cl. ................................. 324/208; 73/136 A
[58] Field of Search ........... 324/34 D, 34 PS, 34 GT, 324/45, 46, 174, 207, 208, 252; 338/32 R, 32 H; 323/94 H; 73/136 A

[56] References Cited

U.S. PATENT DOCUMENTS

| | | | |
|---|---|---|---|
| 3,111,028 | 11/1963 | Lebow ................................. | 73/136 A |
| 3,191,434 | 6/1965 | Brunner et al. ..................... | 73/136 A |
| 3,426,270 | 2/1969 | Reid ...................................... | 324/46 |
| 3,818,326 | 6/1974 | Masuda et al. ..................... | 324/34 PS |
| 3,900,814 | 8/1975 | Masuda ................................ | 338/32 R |

FOREIGN PATENT DOCUMENTS 2,539,548  7/1976  Fed. Rep. of Germany ........... 324/174

*Primary Examiner*—Robert J. Corcoran
*Attorney, Agent, or Firm*—Jacobs & Jacobs

[57] ABSTRACT

A displacement transducer in which two toothed members have magnetic poles arranged in alternating sequence. The toothed members cooperate so that one magnetic pole on one of the members is spaced from a magnetic pole of opposite polarity on the other member. The magnetic poles, furthermore, are spaced so that magnetic flux lines pass through the space or air gap between poles of opposite polarity. A magneto-resistive element is held within that air gap between magnetic poles, and is intercepted by the magnetic flux lines. This magneto-resistive element has an electrical resistance which is dependent on the angular orientation and magnitude of the flux lines with respect to the element. By measuring the electrical resistance of the magneto-resistive element, the angular orientation of the flux lines and thereby the relative displacement of the toothed members may be obtained. The toothed members may have the form of gear racks for measuring linear displacements, or they may be in the form of face gears for providing torque measurements. An electrical bridge connected to the magneto-resistive element provides the indicated displacement measurement.

10 Claims, 8 Drawing Figures

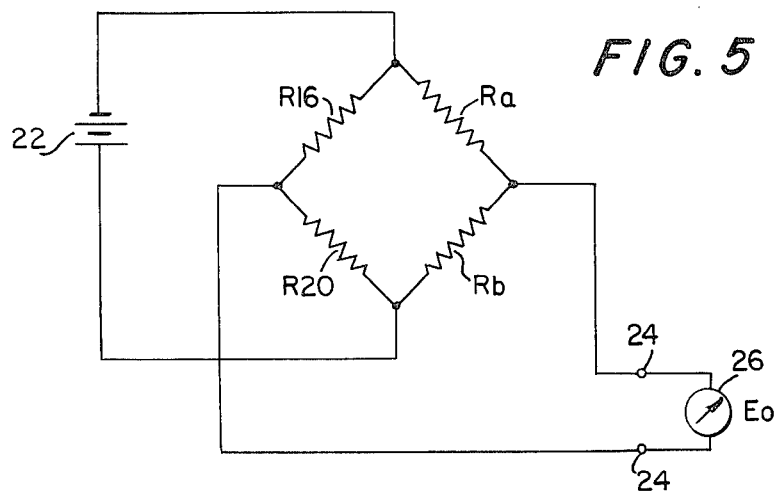
*FIG. 5*
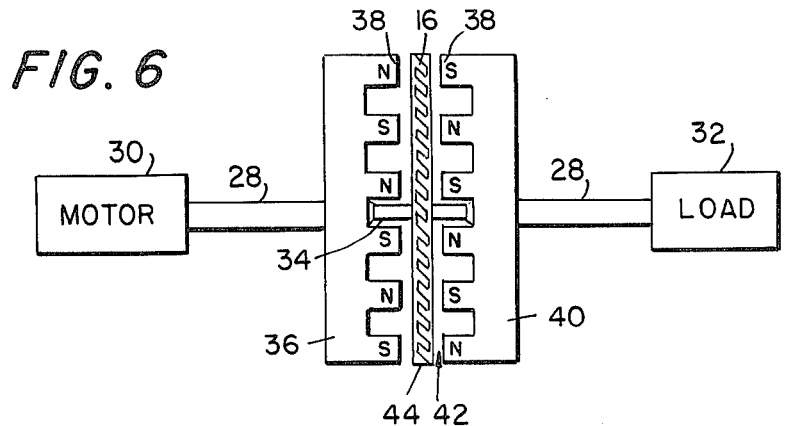
*FIG. 6*
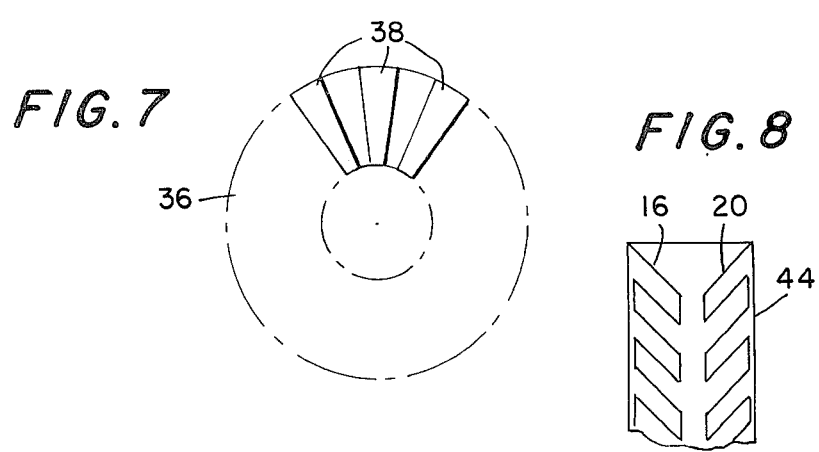
*FIG. 7*
*FIG. 8*

MAGNETORESISTOR DISPLACEMENT SENSOR USING A MAGNETORESISTOR POSITIONED BETWEEN RELATIVELY MOVING MAGNETIZED TOOTHED MEMBERS

BACKGROUND OF THE INVENTION

Displacement transducers known in the art are based on a variety of operating principles resulting in particularly complex devices with inherent structural and operational disadvantages. For example, displacement transducers conventionally used in the art, often involve a variable magnetic coupling system (known as a linear variable differential transformer) which requires an alternating current source for operation. When using such a transducer in conjunction with a balancing bridge, complex electronic circuits are required to detect direction of displacement. Furthermore, such devices are generally affected by the ambient temperature, so that calculated compensations must be applied to obtain precise results.

Accordingly, it is an object of the present invention to provide a displacement transducer which requires only a direct-current source for operation, and will measure displacement without the use of contacting members to which the relative displacement is applied.

Another object of the present invention is to provide a displacement transducer of the foregoing character which may be applicable to force, torque, and strain measurements.

A further object of the present invention is to provide a displacement transducer, as described, which may be economically fabricated and has a substantially long operating life.

SUMMARY OF THE INVENTION

The objects of the present invention are achieved by providing two cooperating toothed elements provided with magnetic poles arranged in alternating sequence thereon. The elements are spaced from each other so as to leave an air gap between the magnetic poles. Within that air gap, a magneto-resistive element is placed and connected to an electrical measuring bridge. The relative displacement between the toothed elements causes a variation in the angular orientation of the magnetic flux lines passing through the air gap and intercepting the magneto-resistive element. The resistance of the magneto-resistive element is dependent on the angle of orientation of the magnetic flux lines with respect to the magneto-resistive element so that the resistance measured by the electrical bridge is an indication of the relative displacement of the toothed members. The element is normally a thin-film strip. Its resistance varies with the orientation and magnitude of the transverse magnetic field, so that the resistance measured by the electrical bridge is an indication of the relative displacement of the toothed members.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 5 is an electrically schematic circuit diagram and shows the measuring bridge used in conjunction with the arrangement of FIG. 4;

FIG. 6 is a schematic view and shows the arrangement of the present invention when used for torque measurements;

FIG. 7 is a plan view of a face of one of the disc-shaped toothed members, used in the arrangement of FIG. 6; and FIG. 8 is a detail view of a preferred embodiment in enlarged scale.

DESCRIPTION OF THE PREFERRED EMBODIMENTS

Figure 1:
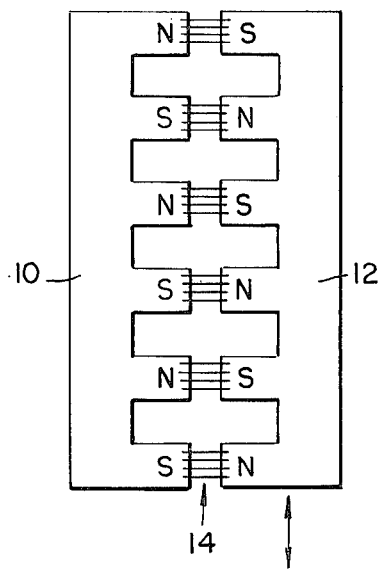
FIG. 1 is a schematic view and shows the arrangement of two toothed members with magnetic poles arranged in cooperative relationship when in an undisplaced position, in accordance with the present invention.

Referring to the drawings and in particular to FIG. 1, two magnetic elements 10 and 12 are provided with a plurality of successive magnetic poles. The elements 10 and 12 may be in the form of toothed elements such as gear racks, for example, with the teeth being magnetic poles of alternating polarity. In an initial undisplaced position, the elements 10 and 12 are arranged relative to each other, so that a north pole of element 10 faces, for example, a south pole of the element 12. The elements 10 and 12 are arranged, furthermore, so that an air gap 14 is left between oppositely facing magnetic poles of these elements. In the undisplaced position of the elements shown in FIG. 1, a north pole of element 10, for example, faces directly opposite the corresponding south pole of the element 12, so that the magnetic flux lines between the pole are normal to the planar surfaces of the magnetic poles.

In the operative displaced position of the arrangement, in accordance with the present invention, the toothed element 12 is displaced relative to the element 10. Such displacement may be obtained, for example, by holding element 10 fixed and moving element 12 relative to element 10. Under such displacement conditions, the magnetic flux lines within the air gap 14, are no longer normal to the planar surfaces of the magnetic pole. Instead, these flux lines form an angle θ which is not a right angle. The magnetic elements 10 and 12 may be in the form of permanent magnets. The direction of the magnetic flux lines in FIG. 2 result from the relative attraction of the poles of opposite polarity.

Figure 2:
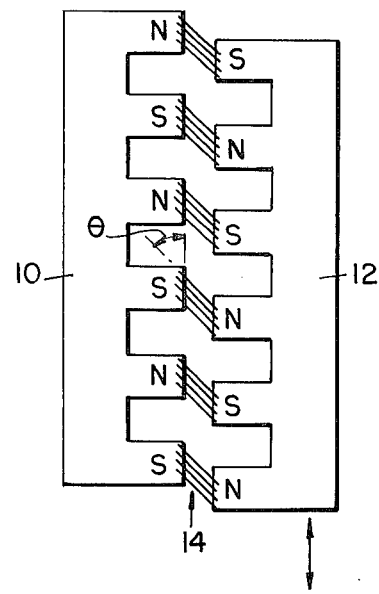
FIG. 2 is a schematic view and shows the arrangement of FIG. 1 after the toothed members have been displaced relative to each other.
Figure 3:
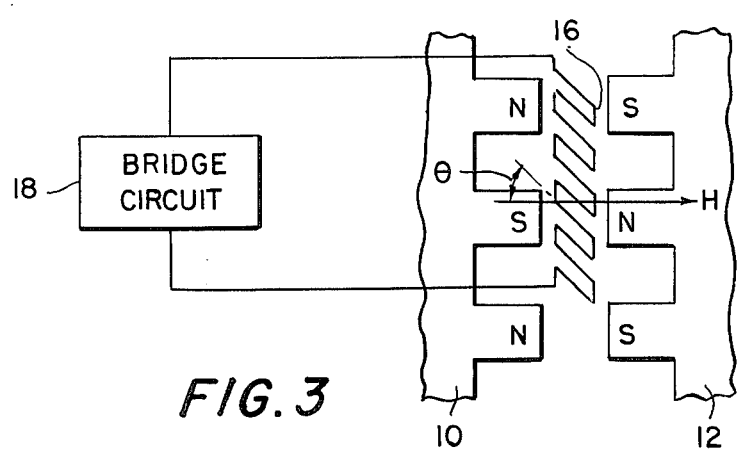
FIG. 3 is a schematic view and shows the circuit arrangement of the magneto-resistive element and measuring bridge.

To measure the relative displacement of elements 10 and 12 in FIG. 2, a thin film element 16 of magneto-resistive material such as shown in FIG. 3 is inserted within the air gap 14.

From FIG. 2, it may be seen that the magnitude of the angle θ is dependent upon the relative displacement of the elements 10 and 12. With the magneto-resistive element 16 inserted within the air gap 14 between the elements 10 and 12, the magnetic flux lines are applied to the film element 16 at varying angle $\theta$ with varying relative displacement of elements 10 and 12. The change in that angle $\theta$ results in a corresponding change in the resistance of the magneto-resistive element 16, and such change in the resistance of this element 16 may be detected by a conventional bridge circuit 18. For purposes of clarity, the film element 16 is not shown in the drawings with a thickness dimension, since such dimension is substantially small. As a result, the thickness of the film is shown by a single line in FIG. 3, for example.

In considering the change of resistance of the element 16 with the angle $\theta$ of the magnetic flux lines, it has been found that this resistance is given by the relationship $$R = R_o + HR_o k \cos^2\theta \qquad (1)$$

where
$R_o$ = resistance in zero field
$H$ = field intensity
$k$ = magneto-resistive constant.

Consequently, by balancing a conventional bridge circuit 18 after elements 10 and 12 have been displaced relative to each other, an indication of the magnitude of $\theta$ and hence of the relative displacement between elements 10 and 12 may be obtained. Whereas the relative displacement between elements 10 and 12 may be obtained by moving element 12 while holding element 10 stationary, such relative displacement may also be realized by holding element 12 stationary and moving element 10. At the same time, it is also possible to move both elements 10 and 12 in opposite directions resulting in relative displacement. The angle $\theta$ is an indication of such relative displacement.

Figure 4:
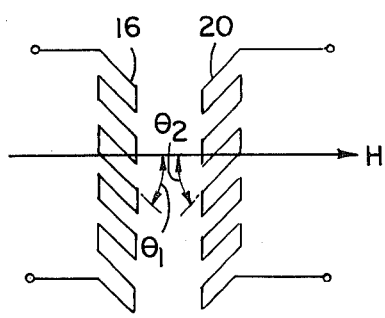
FIG. 4 is a schematic view showing two magneto-resistive elements used in cooperative relationship for increasing the accuracy of displacement measurement.

For purposes of obtaining a more sensitive arrangement in measuring the displacement of the elements 10 and 12, two magneto-resistive films may be placed within the air gap 14 and connected in opposite branches of the bridge circuit 18, as shown in FIG. 5. Thus, by placing a second film or strip magneto-resistive element 29 within the air gap 14, a signal having twice the magnitude may be obtained for balancing the bridge, and as a result greater accuracy in measuring the relative displacement of elements 10 and 12 may be realized. In FIG. 5, the symbol $R_{16}$ represents the electrical resistance of the element 16, whereas the symbol $R_{20}$ represents the resistance of element 20. In FIG. 4, which shows the arrangement of elements 16 and 20 in relation to the direction of the magnetic flux lines, the indicated angles have the sum $\theta_1 + \theta_2 = 90°$.

In the bridge circuit shown in FIG. 5, a d.c. voltage source 22 is used to energize the bridge circuit, and resistors $R_a$ and $R_b$ are conventional resistors used in conjunction with the elements 16 and 20 for purposes of balancing the bridge. The bridge output signal across terminals 24 is proportional to the change in the angle $\theta$, and hence it is proportional to the displacement between elements 16 and 20. By connecting an indicator 26 across the terminals 24, therefore, a direct reading may be obtained of the relative displacement by calibrating the indicator 26 appropriately.

The arrangement in accordance with the present invention, is operable with a d.c. source. Since, furthermore, the arrangement measures the displacement without physical contact between the elements that are displaced, the arrangement is suitable to measurements involving force, torque and strain applications. With respect to the magneto-resistive elements 16 and 20, these may be comprised of materials such as, for example, thin films of permalloy having a content of substantially 81% nickel and 19% iron.

The spacing or air gap 14 between the facing teeth of the toothed elements 16 and 20, may be substantially 10% of the tooth-to-tooth spacing, for example. Each tooth may be made of a permanent magnet arranged in sequence of alternating polarity. Accordingly, the magnetic poles on the toothed elements 16 and 20 may be made of alnico 5 magnets, and when the configuration of FIG. 4 and FIG. 5 is applied, the change in resistivity is substantially 3% for a change in displacement of substantially 10% of the tooth spacing of the elements 16 and 20. Since a conventional bridge has a precision of the order of 0.01%, substantially accurate measurements of the displacements may be obtained. By using two magneto-resistive elements in the configurations of FIGS. 4 and 5, furthermore, an arrangement which is independent of temperature effects may be obtained.

In a further embodiment of the present invention, the displacement transducer is applied for measuring torques transmitted through shafts. In such an arrangement, as shown in FIG. 6, a shaft 28, for example, is driven by a motor 30. The shaft 28 is connected to a load 32 through a necked-down portion of the shaft 34. This necked-down portion permits the two disc-shaped members 36 and 40 to displace relatively and proportionally to the torque transmittal through the shaft 28. Members 36 and 40 each have toothed segments 38 distributed about the face area of the disc. Thus, the disc-shaped members 36 and 40 correspond to face gears in principle, for example, as shown in FIG. 7. Each segment 38, furthermore, is a north or south magnetic pole of the permanent magnet type. The member 36 cooperates with the similarly constructed member 40, so that a north pole on the member 36 faces directly opposite a south pole of the member 40, when in the initial stationary position. An air gap 42 is left between the members 36 and 40, in a similar manner to the arrangement of air gap 14. A disc 44 is placed within the air gap 42, the disc 44 having a film element 16 mounted on the circumferential edge thereof, which is in turn connected to a bridge circuit (not shown) such as bridge circuit 18 of FIG. 3. The element 44 is held stationary with respect to relative motion of the members 36 and 40.

In operation of the arrangement of FIG. 6, when the shaft 28 is driven by motor 30 and the load is substantially negligible, the magnetic toothed segments 38 on the members 36 and 40 will be in alignment, and there are no torsion forces in the shaft 28. When, on the other hand, the load 32 is not of negligible magnitude, then a torque is transmitted through the necked-down shaft coupling 34. As a result of such torque transmission, an angular displacement results between the members 36 and 40, whereby the angular position of member 40 is somewhat behind or lagging the angular position of the member 36. The greater the torque to be transmitted for driving the load 32, the greater will be the angular displacement between members 36 and 40. The angular displacement results in magnetic flux lines which are again not normal to the planar surfaces of the segments 38, for example, and as a result the resistance of the element 16 changes in accordance with the intercepted angle of the flux lines with this element 16. By measuring, therefore, the change in resistance of the element 16 by the bridge, the relative angular displacement of the members 36 and 40 may be obtained. Since such angular displacement of these members 36 and 40 is substantially proportional to the torque transmitted through the coupling 34, the indicator 26 can be made to read directly in terms of torque dimensions and show the magnitude of the torque transmitted to the load. For purposes of increasing the measurement precision of the device, the arrangement of FIG. 4 may also be applied to the operation of FIG. 6, in which case two film elements will extend edgewise around disc 44 (FIG. 8).

The arrangement of FIG. 6 has the advantage that the members 36 and 40 do not contact the sensor 16, and therefore the displacement and hence torque measurement is made without the need of brushes and slip rings that are common elements in the conventional strain gauge type of torque transducer. The measurement arrangement, moreover, will operate to provide a direct DC output of high sensitivity that is proportional to the magnitude and direction of torque. Since detecting element 16 is fixed and responds only to the sum of the flux through it in accordance with equation (1), the output is independent of the speed of rotation of the shaft and, in fact, will operate at zero speed.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A displacement transducer comprising: two toothed members each having magnetic poles arranged in alternating sequence in a predetermined direction; said toothed members being displaceable relative to each other and cooperating so that one magnetic pole on one of said members is spaced from a magnetic pole of opposite polarity on the other member; said magnetic poles being spaced so that magnetic flux lines pass through the space between poles of opposite polarity; at least one element of magneto-resistive material within the space between said magnetic poles and intercepted by said magnetic flux lines, said element having an electrical resistance dependent on the angular orientation and magnitude of said flux lines with respect to said element; said element of magneto-resistive material within said space being stationary and free of contact with both said toothed members, said toothed members being unconnected and spaced from each other to form a gap therebetween, said element being located in said gap independent of the relative positions of said toothed members; and means connected to said element for measuring the electrical resistance thereof, said angular orientation varying with the relative displacement of said toothed members, whereby the measured resistance of said element is dependent on the relative displacement of said toothed members.

2. A displacement transducer according to claim 1 wherein said direction is straight-lined, said toothed members having substantially the shape of gear racks.

3. A displacement transducer according to claim 1 wherein said direction is substantially circular, said tooth member having substantially the shape of face gears.

4. A displacement transducer according to claim 1 wherein two elements of magneto-resistive materials are located within said space between magnetic poles for increasing the signal applied to said measuring means.

5. A displacement transducer according to claim 1 wherein said measuring means comprises an electrical measuring bridge.

6. A displacement transducer according to claim 4 wherein said measuring means comprises an electrical measuring bridge, the resistances of said two elements comprises two separate branches of said bridge.

7. A displacement transducer according to claim 1 wherein the resistance of said magneto-resistive element varies in accordance with the relationship;

$$R = R_o + HR_o K \cos^2 \theta$$

where
 $R_o$ = resistance in zero field
 $H$ = field intensity
 $k$ = magneto-resistive constant.
 $\theta$ = angle between the magneto-resistive element and the flux lines of the field.

8. A displacement transducer according to claim 5 wherein said measuring bridge indicates variation in resistance in terms of displacement units.

9. A displacement transducer comprising: two toothed members each having magnetic poles arranged in alternating sequence in a predetermined direction; said toothed members being displaceable relative to each other and cooperating so that one magnetic pole on one of said members is spaced from a magnetic pole of opposite polarity on the other member; said magnetic poles being spaced so that magnetic flux lines pass through the space between poles of opposite polarity; at least one element of magneto-resistive material within the space between said magnetic poles and intercepted by said magnetic flux lines, said element having an electrical resistance dependent on the angular orientation and magnitude of said flux lines with respect to said element; and means connected to said element for measuring the electrical resistance thereof, said angular orientation varying with the relative displacement of said toothed members, whereby the measured resistance of said element is dependent on the relative displacement of said toothed members; said direction being substantially circular, said tooth member having substantially the shape of face gears; and elongated shaft having opposed ends and a portion of reduced diameter intermediate said ends, said toothed members being mounted on said shaft in opposed relationship to one another at the ends of the portion of reduced diameter; a stationary disc-shaped member having a central bore therethrough, said disc-shaped member being mounted between said opposed toothed members with the reduced portion of the shaft passing through said bore, said element of magneto-resistive material being mounted circumferentially around the edge of said disc-shaped member and located to be intercepted by said magnetic flux lines; one end of said shaft being adapted to be connected to a rotational driving source for rotationally driving said shaft and the other end of the shaft being adapted to be connected to a load means; and said toothed members being angularly displaced relative to each other dependent on the magnitude of said load means when said shaft is rotationally driven, whereby the measured resistance of said element is dependent on the magnitude of said load means and thereby the magnitude of the torque transmitted through said shaft.

10. A displacement transducer as defined in claim 9 wherein said toothed members are comprised of disc-shapedmembers having toothed segments on one face thereof, said toothed segments being permanent magnets of alternating polarity distributed about the face of said disc-shaped member.

* * * * *